(12) United States Patent
Reeder et al.

(10) Patent No.: US 10,036,796 B2
(45) Date of Patent: Jul. 31, 2018

(54) PHANTOM FOR IRON AND FAT QUANTIFICATION MAGNETIC RESONANCE IMAGING

(71) Applicant: Wisconsin Alumni Research Foundation, Madison, WI (US)

(72) Inventors: Scott Brian Reeder, Middleton, WI (US); Diego Hernando, Madison, WI (US); Samir Sharma, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 512 days.

(21) Appl. No.: 14/739,571

(22) Filed: Jun. 15, 2015

(65) Prior Publication Data

US 2016/0363645 A1    Dec. 15, 2016

(51) Int. Cl.
*G01V 3/00* (2006.01)
*G01R 33/58* (2006.01)
*G01R 33/48* (2006.01)

(52) U.S. Cl.
CPC .......... *G01R 33/58* (2013.01); *G01R 33/4828* (2013.01)

(58) Field of Classification Search
CPC .......... G01R 33/28; G01R 33/44; G01R 33/48
USPC .......... 324/318
See application file for complete search history.

(56) References Cited

U.S. PATENT DOCUMENTS

2010/0297019 A1* 11/2010 Lanza ................ A61K 49/0002
424/9.2

FOREIGN PATENT DOCUMENTS

WO    WO 2005007240 A1 *  1/2005 ........... A61K 31/166

* cited by examiner

*Primary Examiner* — Bot Ledynh
(74) *Attorney, Agent, or Firm* — Quarles & Brady LLP

(57) ABSTRACT

Phantoms for use in magnetic resonance imaging ("MRI") and, in particular, for use in quantifying fat concentration, iron concentration, or both, are provided. The phantoms are constructed to accurately reflect in vivo magnetic resonance signal behavior in the presence of both fat and iron. The phantoms described here can thus be used for phantom-based validation of MRI techniques for the joint quantification of fat and iron concentration, for phantom-based validation of MRI techniques for quantifying fat concentration in the presence of iron overload, and for phantom-based validation of MRI techniques for quantifying iron concentration given the confounding presence of fat.

20 Claims, 2 Drawing Sheets

PHANTOM FOR IRON AND FAT QUANTIFICATION MAGNETIC RESONANCE IMAGING

STATEMENT REGARDING FEDERALLY SPONSORED RESEARCH

This invention was made with government support under DK100651, DK083380, DK088925, DK102595, and UL1TR00427 awarded by the National Institutes of Health. The government has certain rights in the invention.

BACKGROUND OF THE INVENTION

The field of the invention is systems and methods for magnetic resonance imaging ("MRI"). More particularly, the invention relates to phantoms for use in calibrating MRI techniques for quantifying fat concentration, iron concentration, or both.

The ability to quantify fat concentration in the body has become increasingly important given the high prevalence of obesity and obesity-related comorbidities. Likewise, the ability to quantify iron concentration in the body is important for monitoring phlebotomy treatment effectiveness in patients with hemochromatosis, and monitoring chelation treatment effectiveness in patients who receive routine blood transfusions (i.e., hemosiderosis). Further, fat and iron often coexist in organs such as the liver, pancreas, and bone marrow. MRI-based techniques for the quantification of fat and iron concentration in tissue have experienced rapid development over the past decade. Validation of these techniques is an essential prerequisite to their widespread clinical translation.

Phantoms are devices that are placed in the bore of an MRI system to test or calibrate its operation. Phantoms may be made of materials having known magnetic resonance properties or they may contain cavities filled with such materials. The MRI system is operated with the phantom in place to produce a spectrum or an image from which proper operation of the MRI system may be determined.

More particularly, phantoms are used in research studies and for quality assurance and calibration in clinical studies. Using these phantoms enables highly controlled validation of the accuracy, precision, and reproducibility of MRI systems and techniques. However, current phantom designs for fat and iron do not accurately replicate the magnetic resonance signal behavior that is observed in vivo, and thus the currently available phantoms are not useful for the validation of MRI-based fat and iron quantification techniques.

Techniques for fat and iron quantification are typically based on the acquisition of chemical shift-encoded magnetic resonance signals. Using these acquired signals, fat and water signal components can be separated based on their different resonance frequencies, and iron concentration can be estimated based on the transverse relaxation rate, $R^*_2$. In general, $R^*_2$ is the rate of decay of the water and fat signals, which is accelerated by the presence of iron in tissue due to the introduction of microscopic magnetic field inhomogeneities.

Traditionally, water-fat phantoms have been constructed using emulsions of deionized water and oil. Alternatively, iron concentration phantoms have usually been constructed by dissolving different concentrations of superparamagnetic iron oxide ("SPIO") nanoparticle contrast agents in water. Other paramagnetic substances (e.g., manganese chloride) have also been used to mimic the effects of iron on magnetic resonance signal relaxation rates. These constructions are often built as agar gels to prevent separation of the different components. Other substances are often added to the phantoms to better replicate in vivo signal behavior (e.g., sodium chloride or cupric sulfate), to maintain the oil-water emulsion (e.g., sodium dodecyl sulfate), as well as to increase the shelf-life of the phantoms (e.g., sodium benzoate, sodium azide).

As mentioned above, previous attempts at constructing water-fat-iron phantoms have been based on mixing prescribed amounts of deionized water, oil, and superparamagnetic iron oxide ("SPIO") nanoparticle contrast agents to achieve the desired fat and iron concentrations. From a composition perspective, these phantoms accurately reflect the materials of interest from which in vivo tissues are composed. However, from a magnetic resonance signal perspective, a significant discrepancy is observed in the behavior of these phantoms versus that observed for in vivo tissue. In particular, MRI experiments have demonstrated that these phantoms exhibit a dual-$R^*_2$ behavior (i.e., the water components and the fat components have different $R^*_2$ signal decay rates), whereas in vivo liver experiments have demonstrated a single-$R^*_2$ behavior in the liver tissue in the presence of iron (i.e., both water and fat have very similar $R^*_2$ signal decay rates). This discrepancy makes currently available water-fat-iron phantoms inadequate for validating quantitative imaging techniques because the signal behavior observed in the phantoms does not match the signal observed in vivo for tissues such as liver.

Currently available water-fat-iron phantoms are therefore not reliably accurate. As clinicians begin adopting use of MRI techniques for fat and iron quantification, there will be a larger need for an accurate calibration and quality assurance phantoms.

SUMMARY OF THE INVENTION

The present invention overcomes the aforementioned drawbacks by providing a phantom use in estimating fat concentration using magnetic resonance imaging ("MRI"). The phantom includes a housing that contains a phantom medium. The phantom medium generally includes a substrate and a plurality of paramagnetic particles. The substrate contains lipid particles in a selected concentration such that the phantom medium has a desired fat concentration value. The plurality of paramagnetic particles are sufficiently large such that magnetic fields generated by the paramagnetic particles when positioned in a magnetic field of an MRI system are sufficient to affect magnetization of the lipid particles in the substrate.

It is another aspect of the invention to provide a phantom for use in estimating fat concentration and iron concentration, wherein the paramagnetic particles are iron-based particles in a selected concentration such that the phantom medium has a desired iron concentration value.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here is a phantom for use in magnetic resonance imaging ("MRI") and, in particular, for use in quantifying fat and iron content using MRI. The phantoms described here accurately reflect in vivo magnetic resonance signal behavior in the presence of both fat and iron. The phantoms described here can thus be used for phantom-based validation of MRI techniques for the joint quantification of fat and iron concentration, for phantom-based validation of MRI techniques for quantifying fat concentration in the presence of iron overload, and for phantom-based validation of MRI techniques for quantifying iron concentration given the confounding presence of fat.

In general, the phantoms are constructed to contain a medium composed of a substrate material containing lipid and paramagnetic particles that have magnetic susceptibilities that are significantly different from the magnetic susceptibilities of water and fat. For example, the paramagnetic particles 18 can include gadolinium-based particles, iron-based particles, manganese-based particles, and so on. The substrate material and the paramagnetic particles are selected such that the relative size difference between the lipid particles in the substrate and the paramagnetic particles is such that magnetic fields generated by the paramagnetic particles are sufficient to significantly affect the magnetization of the substrate material.

As one specific example, the phantom can be constructed using a lipid emulsion substrate and superparamagnetic iron oxide microspheres, which have diameters that are at least two orders of magnitude larger than superparamagnetic iron oxide nanoparticles traditionally used as contrast agents in MRI applications. Initial experiments have demonstrated that the use of these microspheres results in single $R^*_2$ signal decay behavior in water-fat-iron phantoms, which closely mimics the signal behavior of water and fat in vivo. The phantoms described here can be constructed with commercially available materials, and using a simple and straightforward process.

In general, the phantoms for the validation of fat and iron quantification techniques described here are constructed to accurately replicate the magnetic resonance signals observed in vivo. For example, a phantom may be constructed to accurately replicate the magnetic resonance signals observed in the liver, the pancreas, bone marrow, and so on.

Preferably, the phantoms are designed such that a wide range of fat and iron concentrations can be readily achieved. As described below, this design feature can be accomplished by varying the composition of the phantom medium used, and in some embodiments that phantom can include multiple compartments each having different fat and iron concentrations.

Figure 1:
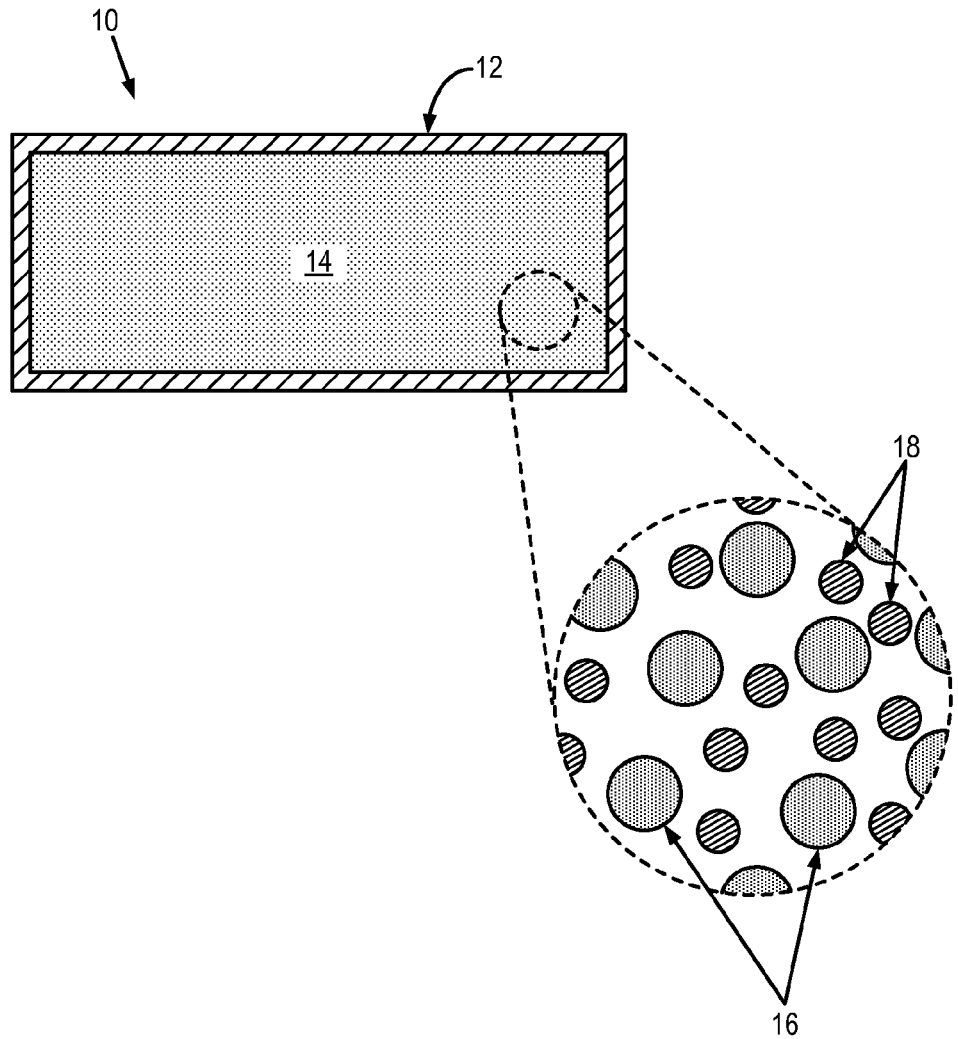
FIG. 1 is an illustration of an example phantom for calibration or quality assurance of MRI-based techniques for quantifying fat concentration, iron concentration, or both.

Referring now to FIG. 1, an example of a phantom 10 for calibrating quantitative MRI techniques, such as fat and iron concentration quantification, is illustrated. The phantom 10 includes a housing 12 that contains a phantom medium 14. In general, the phantom medium 14 is composed of at least a substrate 16 and a plurality of paramagnetic particles 18 that are suspended or otherwise present in the substrate 16. The housing 12 is preferably constructed of an MR-compatible material. As a few non-limiting examples, the housing 12 can be constructed of plastics, such as polycarbonate, polyethylene, polystyrene, polyvinyl chloride, and so on.

The housing 12 can have any suitable shape, including rectangular, cylindrical, spherical, or being shaped to mimic a particular anatomy. As one example, the housing 12 can be cylindrical or spherical to reduce susceptibility effects at the interface of the phantom medium 14 and the wall of the housing 12. In some configurations, the housing 12 can include an opening through which the housing 12 can be filled with the phantom medium 14. In other configurations, the housing 12 is sealed after being filled with the phantom medium 14.

Figure 2:
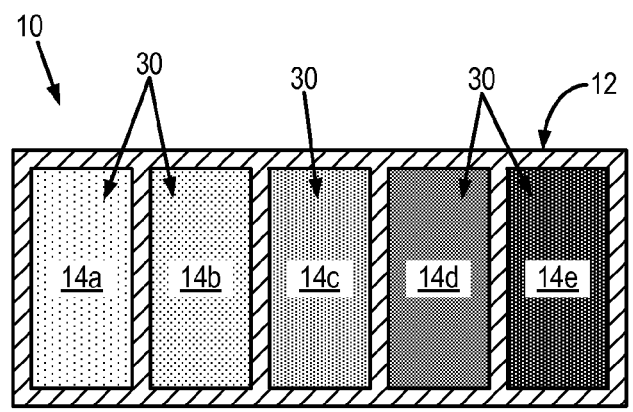
FIG. 2 is an illustration of an example phantom for calibration or quality assurance of MRI-based techniques for quantifying fat concentration, iron concentration, or both, wherein the phantom includes multiple compartments each containing a different phantom medium or a different combined concentration of the same phantom medium.

As shown in FIG. 2, the housing 12 of the phantom 10 can also include multiple different compartments 30 that can be filled with different formulations of the phantom medium 14 (e.g., phantom media 14a-14e). For instance, each compartment 30 can be filled with a phantom medium 14 composed of the same substrate 16 material and paramagnetic particles 18 as other compartments 30, but such that the relative sizes, concentrations, or both between the particles in the substrate 16 and the paramagnetic particles 18 is different. For instance, each compartment 30 may have the same substrate 14, but the size, concentration, or both of the paramagnetic particles 18 could be varied from one compartment 30 to the next. In this manner, each compartment 30 can correspond to a different quantitative value for calibration purposes. As another example, each compartment 30 can be filled with a different phantom medium 14, such as by varying the material used for the substrate 16, the paramagnetic particle 18 type, or both.

In general, the substrate 16 includes lipid particles in a selected concentration, such that the phantom medium 14 has a known fat concentration value that can be compared against values of fat concentration estimated from magnetic resonance images of the phantom 10. As one example, the lipid particles can be lipid droplets. In some embodiments, the substrate 16 thus includes a lipid emulsion containing lipid droplets. For instance, the lipid emulsion can include lipid droplets suspended or otherwise present in water. In general, the substrate 16 is preferably formulated to be stable for a long period of time, such as over several months.

Lipid droplets are generally composed of a lipid core surrounded by a phospholipid monolayer. The size of lipid droplets varies between different cell types and thus the size of available lipid droplets for use in the phantom 10 can span from nanoemulsion scales to macroemulsion scales. As one example, the size of lipid droplets can be selected from the range of tens of nanometers to hundreds of millimeters. As another example, the size of the lipid droplets can be selected from the range of hundreds of nanometers to hundreds of microns, which is the range of sizes typically found in adipose tissue.

Because adipose tissue largely contains lipid droplets, using a substrate 16 that contains lipid droplets helps mimic the magnetic resonance signal behavior of adipose tissue or lipid droplets within relevant tissues, such as hepatocytes. As described below, however, using a substrate 16 that contains lipid droplets requires paramagnetic particles 18 that are sufficiently large to affect the magnetization of the lipid core of the lipid droplets. For example, the paramagnetic particles 18 are selected to be sufficiently large so as to alter the relaxation rates of the water and fat signals in the substrate 16 similar to the way in which the presence of iron in vivo affects the relaxation rates of water and fat, such as by increasing the $R^*_2$ signal relaxation rates of the water and fat.

The substrate 16 and paramagnetic particles 18 are thus selected such that the size of the paramagnetic particles 18 relative to the size of the lipid particles in the substrate 16 is such that when the phantom 10 is positioned in the magnetic field of an MRI system, the paramagnetic particles 18 generate magnetic fields that are able to influence the magnetization of the lipid particles in the substrate 16. As one example, the paramagnetic particles 18 are sized such that when positioned in the magnetic field of an MRI system, the paramagnetic particles 18 generate magnetic fields that are capable of saturating the magnetization of lipid particles in the substrate 16 such that magnetic resonance signals from the lipid particles in the substrate 16 are decreased.

In general, the lipid particles in the substrate 16 and the paramagnetic particles 18 can be selected such that the ratio of the paramagnetic particle size to the lipid particle size is in the range of about 1:1000 to about 50:1. In some embodiments, the lipid particles in the substrate 16 and the paramagnetic particles 18 are selected such that the ratio of the paramagnetic particle size to the lipid particle size is in the range of about 1:100 to about 10:1. In still other embodiments, lipid particles in the substrate 16 and the paramagnetic particles 18 can be selected such that the ratio of the paramagnetic particle size to the lipid particle size is in the range of about 1:10 to about 10:1.

The substrate 16 and paramagnetic particles 18 can also be selected such that the phantom media 14 have magnetic resonance relaxation parameters (e.g., $T_1$, $T_2$, $T^*_2$) that are in the range of those observed in vivo (e.g., in the liver, pancreas, bone marrow). In some embodiments, a doping agent is added to the substrate 16 to ensure that the phantom media 14 have accurate magnetic resonance relaxation parameters. As an example, the doping agent can be a paramagnetic salt. Examples of paramagnetic salts that can be used include cupric sulfate, manganese chloride, nickel chloride, and so on.

In some embodiments, the paramagnetic particles 18 are superparamagnetic particles. As some non-limiting examples, the paramagnetic particles 18 can include superparamagnetic iron oxide ("SPIO") particles, superparamagnetic manganese particles, superparamagnetic iron platinum particles ("SIPPs"), and so on. The size of the paramagnetic particles 18 are then selected based on the criteria described above (e.g., that when positioned in the magnetic field of an MRI system the particles will generate a magnetic field sufficient to influence the magnetization of the substrate 16).

As mentioned above, in some embodiments the paramagnetic particles 18 are iron-based particles such as iron oxide particles, iron platinum particles, and so on. In these embodiments, the paramagnetic particles 18 can be selected to have a known concentration in the phantom medium 14 that can be compared against values of iron concentration estimated from magnetic resonance images of the phantom 10.

Adhering to the relative sizes between lipid particles and paramagnetic particles stated above, in some embodiments, the substrate 16 can include a lipid emulsion containing lipid droplets with diameters in the range of about 0.1 microns and 100 microns, and the paramagnetic particles 18 can include iron oxide particles with diameters in the range of about 10 nanometers to about 10 microns. In still other embodiments, the substrate 16 can include a lipid emulsion containing lipid droplets with diameters in the range of about 0.1 microns and 10 microns, and the paramagnetic particles 18 can include iron oxide particles with diameters in the range of about 1 microns to about 10 microns.

As one specific example, the substrate 16 can include a lipid emulsion containing lipid droplets with diameters of about 0.5 microns, and the paramagnetic particles 18 can include iron oxide particles with diameters in the range of about 3.0 microns to about 6.0 microns. For instance, the substrate 16 can be composed of the lipid emulsion sold under the brand name Intralipid® (Fresenius Kabi; Uppsala, Sweden), and the paramagnetic particles 18 can be iron oxide microspheres, which are larger than the SPIO nanoparticles typically used as contrast agents in MRI applications. An example of iron oxide microspheres that can be used when constructing the phantom 10 include those sold under the trade name COMPEL' (Bangs Laboratories; Fisher, Ind.).

Figure 3:
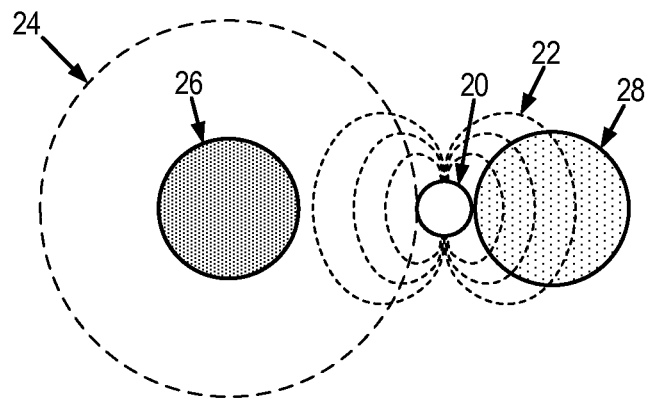
FIG. 3 is an illustration of a superparamagnetic iron oxide ("SPIO") nanoparticle interacting with a lipid droplet and a water molecule, wherein the magnetic fields generated by the SPIO nanoparticle are not sufficient to influence the magnetization of the lipid droplet.

As illustrated in FIG. 3, SPIO nanoparticles 20 are too small to generate magnetic fields 22 that can influence lipid droplets 24 in a lipid emulsion because the lipid core 26 of the lipid droplet 24 is too far removed from the magnetic fields 22 generated by the SPIO nanoparticle 20. On the other hand, water molecules 28 are small enough to be positioned within the magnetic fields 22 generated by the SPIO nanoparticles 20. Thus, SPIO nanoparticles 20 can generate magnetic fields 22 that can significantly influence water molecules 28, even when bound in tissue, but cannot significantly influence lipid droplets 24, whether in a lipid emulsion or in adipose tissue.

Figure 4:
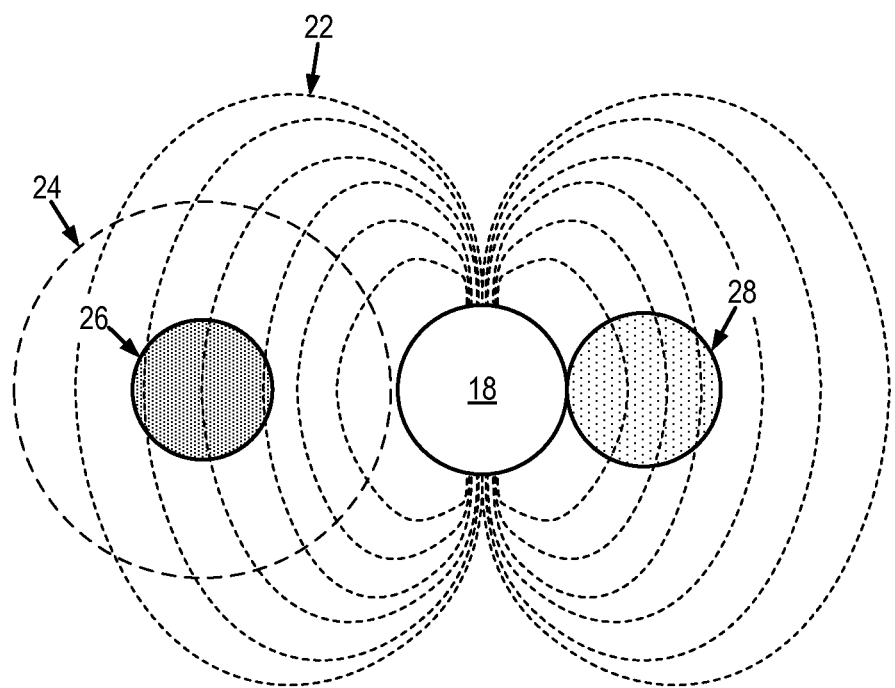
FIG. 4 is an illustration of a superparamagnetic iron oxide ("SPIO") particle interacting with a lipid droplet and a water molecule, wherein the SPIO particle is sufficiently sized so as to generate magnetic fields that can influence the magnetization of the lipid droplet.

When constructing the example phantom 10 described above, SPIO nanoparticles are therefore unlikely to achieve the desired effect on a lipid emulsion substrate 16. Rather, as illustrated in FIG. 4, when the phantom medium 14 used in the phantom 10 is composed of a lipid emulsion substrate 16, the paramagnetic particles 18 can be selected as iron oxide particles that are larger than the traditional SPIO nanoparticles. In general, the paramagnetic particles 18 should be sized such that they are sufficiently large relative to the lipid droplet 24 to generate magnetic fields 22 that can influence the lipid core 26 of the lipid droplets 24 in the lipid emulsion substrate 16. With this configuration, when the phantom 10 is positioned in an MRI system, the paramagnetic particles 18 will generate magnetic fields 22 that are sufficiently strong and far-reaching so as to affect the lipid core 26 of lipid droplets 24 in the substrate 16.

In some embodiments, the phantom medium 14 can be formulated such that the $R^*_2$ signal relaxation rates of water and fat are independently varied. For instance, the phantom medium 14 can be formulated to include two or more different types of paramagnetic particles 18 that variable affect the $R^*_2$ signal relaxation rates of water and fat. As one example of this formulation, the phantom medium 14 could include SPIO nanoparticles in addition to the paramagnetic particles 18 discussed above. As described above, the SPIO nanoparticles are not sufficiently large to affect the magnetization of the lipid core of lipid droplets and, thus, the addition of SPIO nanoparticles to the phantom medium 14 would further alter the $R*_2$ signal relaxation rate of water without further altering the $R*_2$ signal relaxation rate of fat.

Having generally described various phantoms for calibration and quality assurance testing of MRI techniques for quantifying fat and iron concentration, an example method for using the phantoms is now briefly described. The phantom 10 can be used to calibrate an MRI system for use in MRI-based techniques for quantifying fat and iron concentration. The phantom 10 can be positioned in the bore of the MRI system and images of the one or more phantom media 14 in the phantom 10 can be obtained. Because the one or more phantom media 14 are constructed to have known magnetic resonance signal behavior that mimics particular tissue types and physiological conditions, the fat and iron concentrations estimated from these images can be compared to the known fat and iron concentrations of the phantom to calibrate the MRI system.

The phantom 10 can also be used as a part of a quality assurance process, a quality control process, or both. This type of calibration can be performed at the facility where the MRI system is manufactured, or after installation of the MRI system at the clinical site as part of acceptance testing. For instance, the calibration can be performed as part of repairing or otherwise maintaining the MRI system, including periodic accreditation or other scanner quality control qualification procedures. The calibration phantom can also be used for routine quality assurance, where the MRI system can be periodically calibrated to ensure consistent image quality.

The present invention has been described in terms of one or more preferred embodiments, and it should be appreciated that many equivalents, alternatives, variations, and modifications, aside from those expressly stated, are possible and within the scope of the invention.

The invention claimed is:

1. A phantom for use in estimating fat concentration using magnetic resonance imaging (MRI), comprising:
    a housing;
    a phantom medium contained in the housing and comprising a substrate and a plurality of paramagnetic particles, wherein:
    the substrate contains water and lipid particles in a selected concentration such that the phantom medium has a desired fat concentration value; and
    the plurality of paramagnetic particles are sufficiently large such that magnetic fields generated by the paramagnetic particles when positioned in a magnetic field of an MRI system are sufficient to affect magnetization of the lipid particles so that the water particles and the lipid particles in the phantom medium exhibit a single magnetic resonance relaxation decay rate.

2. The phantom as recited in claim 1, wherein the lipid particles are lipid droplets.

3. The phantom as recited in claim 1, wherein the paramagnetic particles are sized to have a diameter in a range of about 1000-times smaller than a diameter of the lipid particles in the substrate to about 50-times larger than the diameter of the lipid particles in the substrate.

4. The phantom as recited in claim 3, wherein the paramagnetic particles are sized to have a diameter in a range of about 100-times smaller than a diameter of the lipid particles in the substrate to about 10-times larger than the diameter of the lipid particles in the substrate.

5. The phantom as recited in claim 4, wherein the paramagnetic particles are sized to have a diameter in a range of about 10-times smaller than a diameter of the lipid particles in the substrate to about 10-times larger than the diameter of the lipid particles in the substrate.

6. The phantom as recited in claim 1, wherein the paramagnetic particles are iron-based particles in a selected concentration such that the phantom medium has a desired iron concentration value.

7. The phantom as recited in claim 6, wherein the paramagnetic particles include at least one of iron oxide particles and iron platinum particles.

8. The phantom as recited in claim 1, wherein the plurality of paramagnetic particles include manganese particles.

9. The phantom as recited in claim 1, wherein the lipid particles in the substrate have diameters in a range from about 0.1 microns to about 100 microns and the paramagnetic particles have diameters in a range from about 10 nanometers to about 10 microns.

10. The phantom as recited in claim 9, wherein the lipid particles in the substrate have diameters in a range from about 0.1 microns to about 10 microns and the paramagnetic particles have diameters in a range from about 1 micron nanometers to about 10 microns.

11. The phantom as recited in claim 10, wherein the lipid particles in the substrate have diameters of about 0.5 microns and the paramagnetic particles have diameters in a range from about 3.0 microns to about 6.0 microns.

12. The phantom as recited in claim 1, wherein the housing has formed therein a plurality of compartments, and wherein each compartment contains a different phantom medium such that each compartment corresponds to a different fat concentration value.

13. The phantom as recited in claim 12, wherein the paramagnetic particles are iron-based particles in a selected concentration in each compartment such that each different phantom medium has a same desired iron concentration value.

14. The phantom as recited in claim 12, wherein the paramagnetic particles are iron-based particles in a different selected concentration in each compartment such that each different phantom medium has a different desired iron concentration value.

15. The phantom as recited in claim 1, wherein the housing has formed therein a plurality of compartments such that each compartment contains a different phantom medium having a different combined concentration of lipid particles and super-paramagnetic particles.

16. The phantom as recited in claim 15, wherein the paramagnetic particles are iron-based particles and each different phantom medium has a same fat concentration value and a different iron concentration value.

17. The phantom as recited in claim 1, wherein the paramagnetic particles are superparamagnetic particles.

18. The phantom as recited in claim 1, wherein the phantom medium further comprises a selected concentration of a doping agent that is selected such that the phantom medium has desired magnetic resonance relaxation properties.

19. The phantom as recited in claim 18, wherein the doping agent includes at least one of cupric sulfate, manganese chloride, or nickel chloride.

20. The phantom as recited in claim 1, wherein the phantom medium further comprises superparamagnetic nanoparticles that are sufficiently small such that magnetic fields generated by the superparamagnetic nanoparticles when positioned in a magnetic field of an MRI system are insufficient to affect magnetization of the lipid particles in the substrate, but are sufficient to affect magnetization of the water in the substrate, thereby resulting in a greater increase in $R^*_2$ for the water in the substrate than the lipid particles in the substrate.

\* \* \* \* \*

UNITED STATES PATENT AND TRADEMARK OFFICE
CERTIFICATE OF CORRECTION

PATENT NO. : 10,036,796 B2
APPLICATION NO. : 14/739571
DATED : July 31, 2018
INVENTOR(S) : Reeder et al.

It is certified that error appears in the above-identified patent and that said Letters Patent is hereby corrected as shown below:

Column 1, Line 10, "UL1TR000427" should be --TR000427--.

Signed and Sealed this
Second Day of October, 2018

Andrei Iancu
*Director of the United States Patent and Trademark Office*